(12) United States Patent  
Zhou et al.

(10) Patent No.: US 12,437,576 B2
(45) Date of Patent: Oct. 7, 2025

(54) DISPLAY PANEL, DISPLAY DEVICE, AND PREPARATION METHOD FOR DISPLAY PANEL

(71) Applicants: Kunshan New Flat Panel Display Technology Center Co., Ltd., Kunshan (CN); Hefei Visionox Technology Co., Ltd., Hefei (CN)

(72) Inventors: Xiaokang Zhou, Kunshan (CN); Xingxing Chen, Kunshan (CN); Hajime Yamaguchi, Hefei (CN); Kunjing Zhong, Kunshan (CN); Qingrong Ren, Kunshan (CN); Rubo Xing, Kunshan (CN)

(73) Assignees: Kunshan New Flat Panel Display Technology Center Co., Ltd., Kunshan (CN); Hefei Visionox Technology Co., Ltd., Hefei (CN)

( * ) Notice: Subject to any disclaimer, the term of this patent is extended or adjusted under 35 U.S.C. 154(b) by 0 days.

(21) Appl. No.: 19/006,273

(22) Filed: Dec. 31, 2024

(65) Prior Publication Data

US 2025/0239100 A1    Jul. 24, 2025

(30) Foreign Application Priority Data

Jan. 19, 2024   (CN) .......................... 202410084813.7

(51) Int. Cl.
    *G06V 40/13*      (2022.01)
    *H10K 50/165*      (2023.01)
    *H10K 59/65*      (2023.01)

(52) U.S. Cl.
    CPC ....... *G06V 40/1318* (2022.01); *H10K 50/165* (2023.02); *H10K 59/65* (2023.02)

(58) Field of Classification Search
CPC .. G06V 40/1318; H10K 50/165; H10K 59/65; H10K 39/34
See application file for complete search history.

(56) References Cited

U.S. PATENT DOCUMENTS

| | | | |
|---|---|---|---|
| 10,886,492 B2 * | 1/2021 | Li | H10K 50/16 |
| 11,568,036 B2 * | 1/2023 | Park | G06V 40/13 |
| 2022/0271110 A1 * | 8/2022 | Nan | H10K 59/122 |

FOREIGN PATENT DOCUMENTS

CN             116941343 A     10/2023

* cited by examiner

*Primary Examiner* — Abhishek Sarma
(74) *Attorney, Agent, or Firm* — Kilpatrick Townsend & Stockton LLP

(57) ABSTRACT

The present application provides a display panel, a display device, and a preparation method for the display panel. The display panel includes: a substrate; a light-emitting unit including a first hole blocking layer; and a photoelectric sensing unit being configured to receive an optical signal and generate a corresponding electrical signal from the optical signal, the photoelectric sensing unit including a photoelectric conversion layer, a buffer layer being arranged on a side of the photoelectric conversion layer away from the substrate and a second hole blocking layer being arranged on a side of the buffer layer away from the photoelectric conversion layer; wherein the first hole blocking layer and the second hole blocking layer are made of the same material, the buffer layer has a first electrical conductivity, and the second hole blocking layer has a second electrical conductivity, the first electrical conductivity being greater than the second electrical conductivity.

20 Claims, 9 Drawing Sheets

DISPLAY PANEL, DISPLAY DEVICE, AND PREPARATION METHOD FOR DISPLAY PANEL

CROSS-REFERENCE TO RELATED APPLICATIONS

This application claims priority to Chinese Patent Application No. 202410084813.7, entitled "DISPLAY PANEL, DISPLAY DEVICE, AND PREPARATION METHOD FOR DISPLAY PANEL" and filed on Jan. 19, 2024, which is hereby incorporated by reference in its entirety.

TECHNICAL FIELD

The disclosure relates to the technical field of display devices, and particularly to a display panel, a display device, a preparation method for the display panel.

BACKGROUND ART

Biometric recognition plays an important role in smart phones and tablet computers. There are two common methods in the prior art, that is, facial recognition and fingerprint recognition. The fingerprint recognition involves an ultrasonic fingerprint, a capacitive fingerprint, an optical fingerprint, etc. The optical fingerprint has the advantages of high resolution, high sensitivity and the capability of performing life health inspection.

SUMMARY OF THE INVENTION

Embodiments of the disclosure provide a display panel, a display device and a preparation method for the display panel, with a view to enhancing the performance of a photo detector in a display panel.

An embodiment in a first aspect of the disclosure provides a display panel. The display panel includes: a substrate having a first side; a light-emitting unit arranged on the first side, the light-emitting unit including a first hole blocking layer; and a photoelectric sensing unit arranged on the first side, where the photoelectric sensing unit is configured to receive an optical signal and generate a corresponding electrical signal from the optical signal, and the photoelectric sensing unit includes a photoelectric conversion layer, a buffer layer and a second hole blocking layer, the buffer layer being arranged on a side of the photoelectric conversion layer away from the substrate, and the second hole blocking layer being arranged on a side of the buffer layer away from the photoelectric conversion layer; where the first hole blocking layer and the second hole blocking layer are made of the same material, the buffer layer has a first electrical conductivity, and the second hole blocking layer has a second electrical conductivity, the first electrical conductivity being greater than the second electrical conductivity.

An embodiment in a second aspect of the disclosure further provides a display device, including a display panel according to any one of the above-described embodiments in the first aspect.

An embodiment in a third aspect of the disclosure further provides a preparation method for a display panel. The preparation method includes:

preparing a photoelectric conversion layer of a photoelectric sensing unit on a first side of a substrate, where the photoelectric sensing unit is configured to receive an optical signal and generate a corresponding electrical signal from the optical signal;

preparing a buffer layer on a side of the photoelectric conversion layer away from the substrate, where the buffer layer has a first electrical conductivity; and preparing, on the first side, a first hole blocking layer of a light-emitting unit, and preparing a second hole blocking layer on a side of the buffer layer away from the photoelectric conversion layer, where the first hole blocking layer and the second hole blocking layer are made of the same material, and the second hole blocking layer has a second electrical conductivity, the first electrical conductivity being greater than the second electrical conductivity.

In an embodiment of the disclosure, the display panel includes a substrate, a light-emitting unit and a photoelectric sensing unit. The light-emitting unit is configured to achieve luminous display of the display panel, and the photoelectric sensing unit is configured to achieve a photoelectric sensing function of the display panel. Optionally, the light-emitting unit further includes a light-emitting layer, and the first hole blocking layer is configured to block the movement of holes from the light-emitting layer in a direction away from the substrate, so as to improve the light-emitting efficiency. The second hole blocking layer is configured to block the movement of holes from the photoelectric conversion layer in a direction away from the substrate, so as to enhance the photoelectric sensing performance. The buffer layer is arranged between the second hole blocking layer and the photoelectric conversion layer, the electrical conductivity of the buffer layer is greater than the electrical conductivity of the second hole blocking layer, and there is a smaller potential barrier between the buffer layer and the photoelectric conversion layer, so that the potential barrier between the second hole blocking layer and the photoelectric conversion layer can be reduced, the efficiency of electron transport can be improved, and the performance of the photoelectric conversion layer can be enhanced. Therefore, according to an embodiment of the disclosure, the performance of a photo detector of the display panel can be enhanced by adding the buffer layer between the photoelectric conversion layer and the second hole blocking layer.

BRIEF DESCRIPTION OF THE DRAWINGS

By reading the following detailed description made with reference to the drawings for non-limiting embodiments, the other features, objectives and advantages of the disclosure will become more apparent, in which the same or similar features are denoted by the same or similar reference numerals.

DETAILED DESCRIPTION OF EMBODIMENTS

Figure 1:
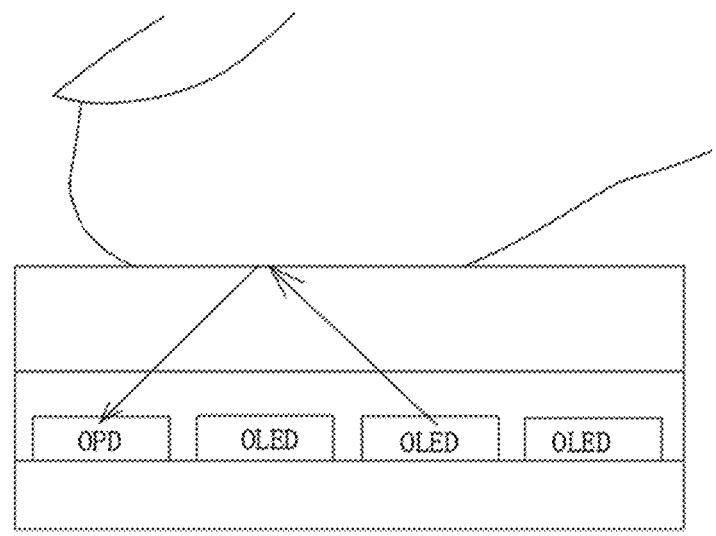
FIG. 1 is a schematic structural diagram of a display panel according to a related embodiment.

The features and exemplary embodiments of the disclosure in various aspects will be described in detail below. In the following detailed description, many specific details are set forth to comprehensively understand the disclosure. However, it will be very apparent to those skilled in the art that the disclosure may be implemented without some of these specific details. The following description of the embodiments are merely to provide a better understanding for the disclosure by illustrating examples of the disclosure. In the drawings and the following description, at least part of known structures and techniques are not shown to avoid unnecessary ambiguousness of the disclosure; and for the ease of clarity, the dimensions of part of the structure may be enlarged. In addition, the features, structures or characteristics described below may be combined, in any suitable manner, in one or more embodiments.

In the description of the disclosure, it should be noted that "a plurality of" means two or more, unless otherwise specified. The orientation or position relationship indicated by the terms "upper", "lower", "left", "right", "inner", "outer", etc. is merely for the convenience of describing the disclosure and simplifying the description, rather than indicating or implying that a device or element referred to must have a particular orientation or be constructed and operated in a particular orientation, and therefore should not be construed as limiting the disclosure. Moreover, the terms such as "first" and "second" are merely used for the illustrative purpose, and should not be construed as indicating or implying the relative importance.

The orientation terms used in the following description all indicate directions shown in the accompanying drawings, and do not limit the specific structure of the embodiment of the disclosure. In the description of the disclosure, it should also be noted that unless otherwise explicitly specified and defined, the terms "mounting" and "connection" should be understood in a broad sense, for example, they may be a fixed connection, a detachable connection, or an integrated connection, and may be a direct connection, or an indirect connection. For those of ordinary skill in the art, the specific meanings of the terms mentioned above in the disclosure may be construed according to specific circumstances.

Biometric recognition plays an important role in mobile terminals such as smart phones and tablet computers. There are two common methods in the prior art, that is, facial recognition and fingerprint recognition. The fingerprint recognition involves an ultrasonic fingerprint, a capacitive fingerprint, an optical fingerprint, etc. The optical fingerprint has become the mainstream technical means thanks to its advantages of high resolution, high sensitivity and the capability of performing life health inspection.

FIG. 1 shows a display panel provided in the related art, and a light transmission path is shown by arrows in FIG. 1. It should be noted that a larger integrated area and a thinner overall thickness can be achieved by jointly integrating organic light emitting diodes and photoelectric sensors in the panel. An organic photo detector (OPD) prepared on the basis of an organic photosensitive material is compatible with a vacuum evaporation process for an organic light emitting diode (OLED), which is an important direction for integrating fingerprint recognition into a panel in the future.

Figure 2:
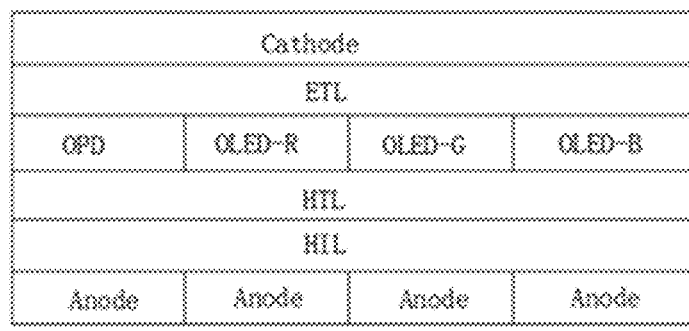
FIG. 2 is a schematic diagram of a layer structure of a display panel according to a related embodiment.

As shown in FIG. 2, the OPD typically includes a cathode, anodes, an active layer (or referred to as a photosensitive layer) and a carrier layer, and is a photoelectric device that converts an incident light signal into an electrical signal, while the organic light emitting diode is a device that converts an electrical signal into an optical signal.

The active layer of the OPD generally includes two organic materials with energy levels staggered, where one of the materials is a donor, and a typical donor includes a copper phthalocyanine oligomer (chemical symbol: CuPc), butyl phthalate (abbreviated as: DBP), etc.; and the other material is an acceptor, and a typical acceptor includes fullerenes (for example, C60 and C70, where C60 is a molecule composed of 60 carbon atoms, C60 is also referred to as buckyball, and C70 is a molecule composed of 70 carbon atoms). An operating principle of the OPD may include the following steps which respectively involve: the materials absorbing light to generate excitons; the excitons diffusing to a donor-acceptor interface; the excitons diffusing to the donor-acceptor interface and being subject to charge separation; and charge transport and collection. In order to improve the efficiency of exciton dissociation, the donor and the acceptor are typically mixed together (co-evaporated) to serve as the active layer.

In order to increase the efficiency of carrier collection, a reverse bias voltage, such as −3V, is generally additionally applied to the cathode and the anodes of the OPD. However, this reverse voltage also increases the injection of dark currents.

The OPD is generally configured to implement a photoelectric sensing function. For example, the OPD may be used for image recognition. Further, when the OPD is configured to implement fingerprint recognition, the OPD is required to have a higher recognition precision, and therefore the OPD needs to have a higher signal to interference plus noise ratio (SNR). It should be noted that the magnitude of the signal to interference plus noise ratio is related to external quantum efficiency (EQE) in the OPD. Specifically, the EQE represents a ratio of the number of photoelectrons running through the device to the number of photons entering the device during illumination, that is, the capability of converting light into electricity. The EQE is the most basic parameter of the OPD, and therefore maximizing the EQE is the direction of OPD device optimization and product performance improvement.

Figure 3:
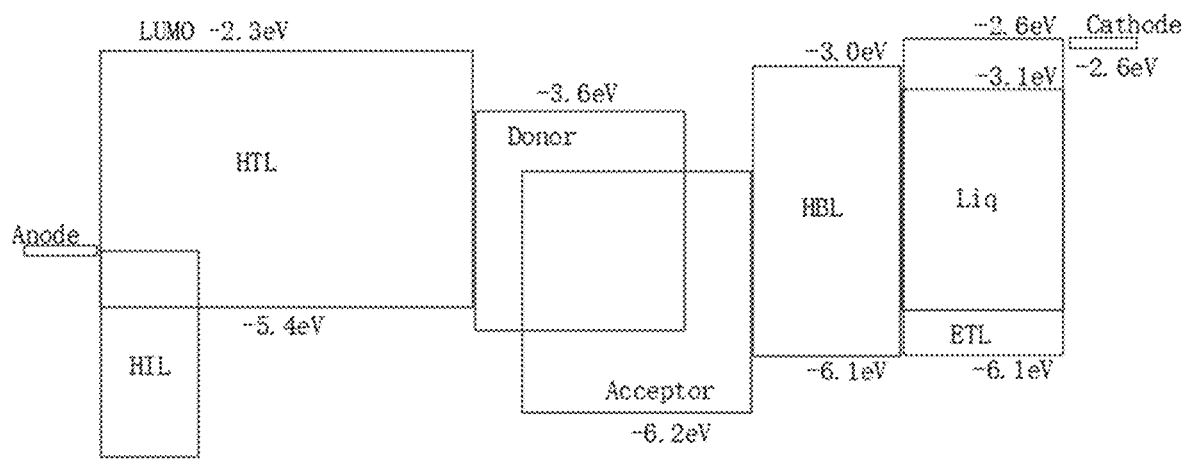
FIG. 3 is a schematic diagram of an energy level structure of a display panel according to a related embodiment.

In an integrated application of OPD and OLED, in consideration of the costs and process difficulties, the OPD needs to share some carrier layers with the OLED, as shown in FIG. 3. Although this integration method is cost-effective, the performance of the OPD device is also reduced. For example, when a hole blocking layer and an electron transport layer of the OLED are arranged on the active layer of the OPD, since a lowest unoccupied molecular orbital (LUMO) of the hole blocking layer of the OLED has an energy level of about −3.0 electron volts, and a commonly used acceptor of the OPD has a LUMO energy level of about −4.0 electron volts, there is a potential barrier of about 1 electron volt between the two energy levels, which significantly affects the extraction of the photoelectrons and significantly reduces the EQE of the device.

In order to solve the above technical problem, in the integrated application of OPD and OLED according to the embodiments of the disclosure, an interfacial modification film layer is introduced in an OPD device structure so as to reduce or eliminate this potential barrier, solve the above-described problem that the extraction of the photoelectrons is hampered, and improve the EQE of the OPD device.

In order to better understand the disclosure, a display panel and a display device according to the embodiments of the disclosure will be described below with reference to FIGS. 4 to 21.

Figure 4:
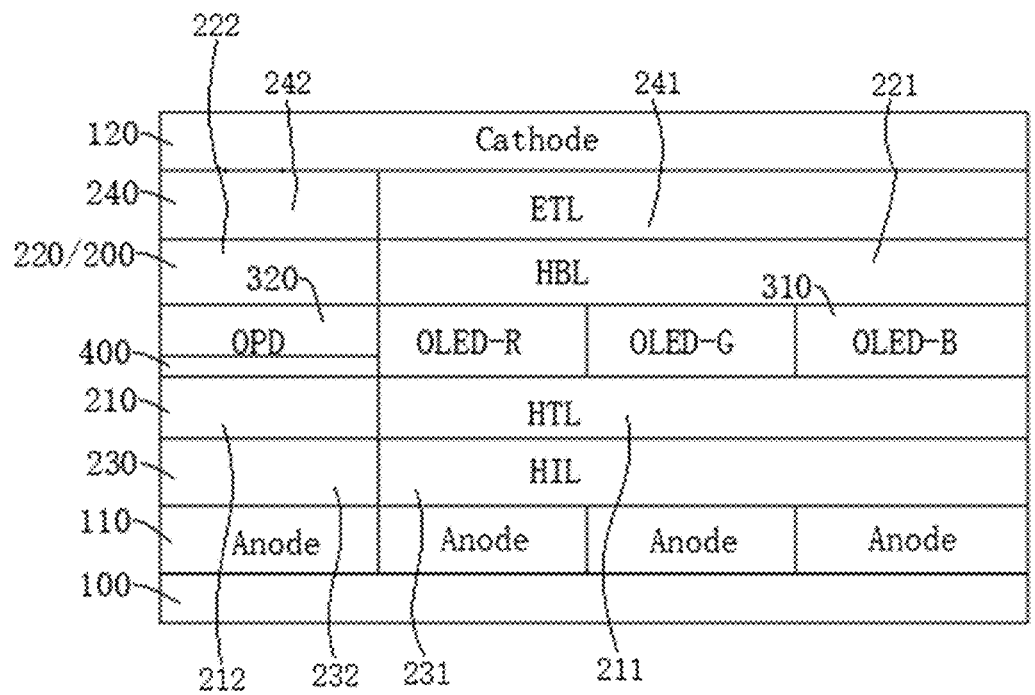
FIG. 4 is a schematic diagram of a layer structure of a display panel according to an embodiment of the disclosure.
Figure 5:
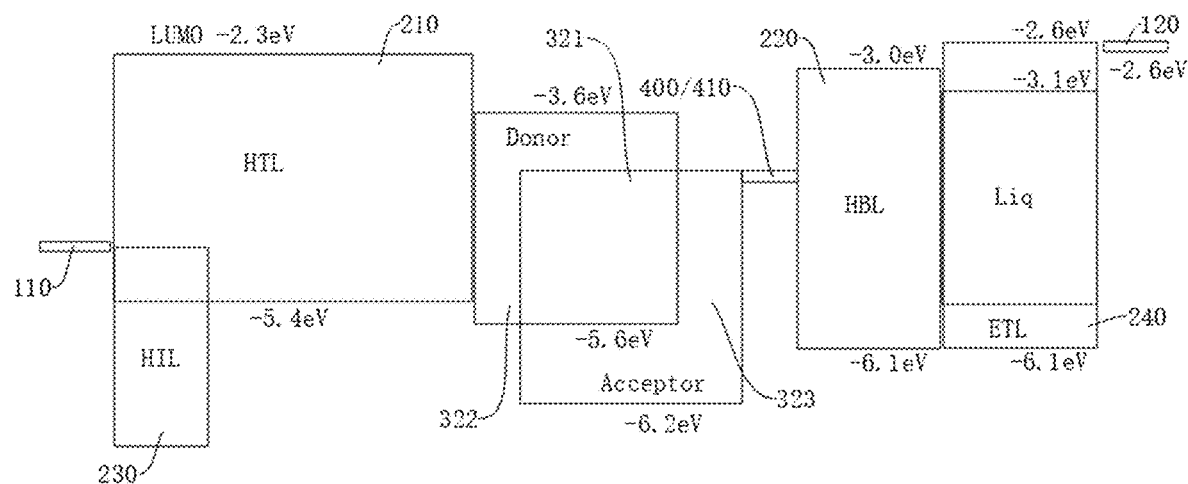
FIG. 5 is a schematic diagram of an energy level structure of a display panel according to an embodiment of the disclosure.

Referring to FIGS. 4 and 5 together, FIG. 4 is a schematic diagram of a layer structure of a display panel according to an embodiment of the disclosure; and FIG. 5 is a schematic diagram of an energy level structure of a display panel according to an embodiment of the disclosure.

As shown in FIGS. 4 and 5, an embodiment in a first aspect of the disclosure provides a display panel, including: a substrate 100, a light-emitting unit, and a photoelectric sensing unit; where the light-emitting unit is arranged on a first side of the substrate 100, the light-emitting unit including a first hole blocking layer 221; the photoelectric sensing unit is arranged on the first side of the substrate 100, and the photoelectric sensing unit includes a photoelectric conversion layer, a buffer layer 400 and a second hole blocking layer 222, the buffer layer 400 being arranged on a side of the photoelectric conversion layer 320 away from the substrate 100, and the second hole blocking layer 222 being arranged on a side of the buffer layer 400 away from the photoelectric conversion layer 320; and where the first hole blocking layer 221 and the second hole blocking layer 222 are made of the same material, the buffer layer 400 has a first electrical conductivity, and the second hole blocking layer 222 has a second electrical conductivity, the first electrical conductivity being greater than the second electrical conductivity.

In an embodiment of the disclosure, the display panel includes a substrate 100, a light-emitting unit and a photoelectric sensing unit. The light-emitting unit is configured to achieve luminous display of the display panel, and the photoelectric sensing unit is configured to achieve a photoelectric sensing function of the display panel. Optionally, the light-emitting unit further includes a light-emitting layer 310, and the first hole blocking layer 221 is configured to block the movement of holes from the light-emitting layer 310 in a direction away from the substrate 100, so as to improve the light-emitting efficiency. The second hole blocking layer 222 is configured to block the movement of holes from the photoelectric conversion layer 320 in a direction away from the substrate 100, so as to enhance the photoelectric sensing performance. The buffer layer 400 is arranged between the second hole blocking layer 222 and the photoelectric conversion layer 320, the electrical conductivity of the buffer layer 400 is greater than the electrical conductivity of the second hole blocking layer 222, and there is a smaller potential barrier between the buffer layer 400 and the photoelectric conversion layer 320, so that the potential barrier between the second hole blocking layer 222 and the photoelectric conversion layer 320 can be reduced, the efficiency of electron transport can be improved, and the performance of the photoelectric conversion layer 320 can be enhanced. Therefore, according to an embodiment of the disclosure, the performance of a photo detector of the display panel can be enhanced by adding the buffer layer 400 between the photoelectric conversion layer 320 and the second hole blocking layer 222.

Optionally, the light-emitting unit is a structure for converting an electrical signal into an optical signal to achieve the luminous display of the display panel. Optionally, the photoelectric sensing unit is a structure for converting an optical signal line into an electrical signal so as to achieve the photoelectric detection function of the display panel. Optionally, the photoelectric sensing unit may be the OPD device mentioned above.

Optionally, the display panel further includes a first electrode 110 and a second electrode 120, the first electrode 110 and the second electrode 120 being arranged separately on two sides of the light-emitting unit and the photoelectric sensing unit, the first electrode 110 and the second electrode 120 can drive the light-emitting unit to emit light, and the first electrode 110 and the second electrode 120 can also transmit a signal of the photoelectric sensing unit. Optionally, the substrate 100 further includes a drive circuit for driving the light-emitting unit to emit light.

Optionally, one of the first electrode 110 and the second electrode 120 is an anode, and the other is a cathode. An embodiment of the disclosure is exemplified by using the first electrode 110 as the anode and the second electrode 120 as the cathode. A material of the first electrode 110 may include indium tin oxide, and a material of the second electrode 120 may include magnesium (chemical symbol: Mg), silver (chemical symbol: Ag), ytterbium (chemical symbol: Yb), etc.

Optionally, the first hole blocking layer 221 and the second hole blocking layer 222 may be integrally arranged to form the hole blocking layer 220. Thus, the first hole blocking layer 221 and the second hole blocking layer 222 can be prepared and formed in the same process step without patterning, and a preparation process of the display panel can be simplified. Optionally, in some implementations, there may also be a spacing between the first hole blocking layer 221 and the second hole blocking layer 222.

Optionally, the light-emitting unit further includes a first hole transport layer 211, a first hole injection layer 231 and a first electron transport layer 241. Optionally, the photoelectric sensing unit further includes a second hole transport layer 212, a second hole injection layer 232 and a second electron transport layer 242. Optionally, the first hole transport layer 211 and the second hole transport layer 212 are integrally arranged to form a hole transport layer 210. Optionally, the first hole injection layer 231 and the second hole injection layer 232 are integrally arranged to form a hole injection layer 230. Optionally, the first electron transport layer 241 and the second electron transport layer 242 are integrally arranged to form an electron transport layer 240.

Optionally, in some implementations, there may also be a spacing between the first hole transport layer 211 and the second hole transport layer 212. Optionally, in some implementations, there may also be a spacing between the first hole injection layer 231 and the second hole injection layer 232. Optionally, in some implementations, there may also be a spacing between the first electron transport layer 241 and the second electron transport layer 242.

Optionally, the hole injection layer 230 is arranged on a side of the hole transport layer 210 away from the photoelectric conversion layer 320 and the light-emitting layer 310, and the electron transport layer 240 is arranged on a side of the hole blocking layer 220 away from the substrate 100.

Optionally, the light-emitting layer 310 and the photoelectric conversion layer 320 are arranged in the same layer and constitute a part of a functional layer 300. The hole transport layer 210, the hole blocking layer 220, the hole injection layer 230 and the electron transport layer 240 constitute a part of a common layer 200.

In some optional embodiments, the photoelectric conversion layer 320 includes a donor and an acceptor, the donor and the acceptor interacting with each other to achieve the photoelectric sensing function.

Optionally, the photoelectric conversion layer 320 includes a hybrid layer 321, a material of the hybrid layer 321 including a donor and an acceptor.

Optionally, the photoelectric conversion layer 320 further includes a donor layer 322, the donor layer 322 being located on a side of the hybrid layer 321 facing the substrate 100, and a material of the donor layer 322 including the donor; and/or, the photoelectric conversion layer 320 further includes an acceptor layer 323, the acceptor layer 323 being located on a side of the hybrid layer 321 away from the substrate 100, and a material of the acceptor layer 323 including the acceptor.

The buffer layer 400 may be arranged in a variety of materials, and may include a metal element, so that the buffer layer 400 may have a higher electrical conductivity, and the buffer layer 400 may more easily transport electrons.

In some optional embodiments, still referring to FIGS. 4 and 5, the buffer layer 400 includes a first buffer layer 410, and a material of the first buffer layer 410 includes a metal. Specifically, the material of the first buffer layer 410 includes a metal, so that interfacial energy levels between the first buffer layer 410 and a film layer in contact with the first buffer layer 410 can be rearranged to reduce an interfacial potential barrier.

The first buffer layer 410 may be of a single film layer structure.

Figure 6:
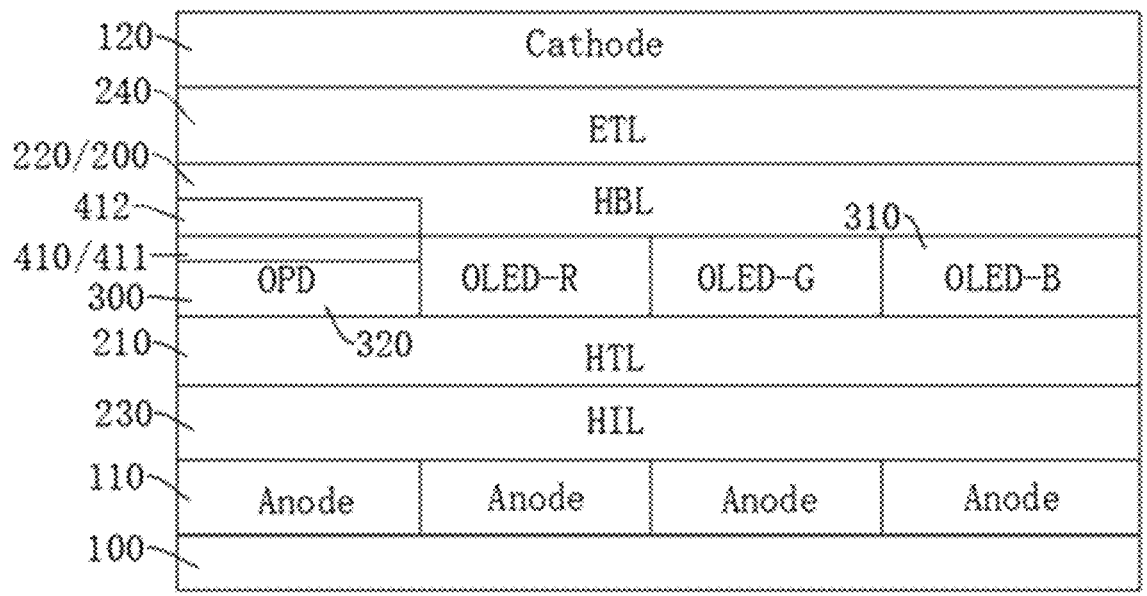
FIG. 6 is a schematic diagram of a layer structure of a display panel according to another embodiment of the disclosure.
Figure 7:
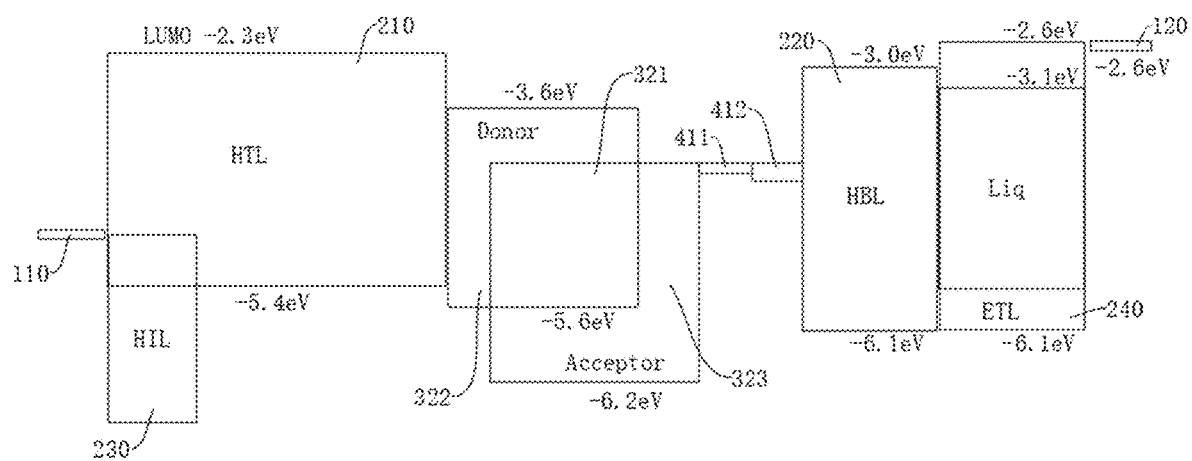
FIG. 7 is a schematic diagram of an energy level structure of a display panel according to another embodiment of the disclosure.

Alternatively, as shown in FIGS. 6 and 7, the first buffer layer 410 may include two or more sublayers arranged in a stacked manner. By providing a plurality of sublayers, the electrical conductivity of the first buffer layer 410 can be adjusted at different thickness positions, so that the potential barrier between the first buffer layer 410 and the photoelectric conversion layer 320 can be reduced, and the potential barrier between the first buffer layer 410 and the second hole blocking layer 222 can also be lowered.

Optionally, a thickness of the first buffer layer 410 is not less than 0.1 nanometers, and the thickness of the first buffer layer 410 is not greater than 5 nanometers, so that it is possible to ensure that the thickness of the first buffer layer 410 is not excessively small to affect the degree to which the first buffer layer improves the potential barrier between the photoelectric conversion layer 320 and the second hole blocking layer 222, and it is also possible to ensure that the thickness of the first buffer layer 410 is not excessively large to affect the efficiency of signal transmission due to an excessively long transmission path of the electrons.

Further, optionally, the thickness of the first buffer layer 410 is not less than 0.5 nanometers, and the thickness of the first buffer layer 410 is not greater than 2 nanometers, so that the first buffer layer 410 has a preferable thickness, which can mitigate the problem of an excessively large potential barrier between the photoelectric conversion layer 320 and the second hole blocking layer 222 without affecting the electron transport. Moreover, it is possible to solve the problem of lateral crosstalk of the electrons due to the excessively large thickness of the first buffer layer 410.

In some optional embodiments, when the first buffer layer 410 includes a first sublayer 411 and a second sublayer 412, the second sublayer 412 is located on a side of the first sublayer 411 facing the second hole blocking layer 222. That is, the first sublayer 411 is arranged closer to the photoelectric conversion layer 320 compared with the second sublayer 412. The first sublayer 411 and the second sublayer 412 may have the same thickness and use the same material.

Alternatively, in some other embodiments, a thickness of the first sublayer 411 is less than a thickness of the second sublayer 412.

In these optional embodiments, the thickness of the first sublayer 411 is less than the thickness of the second sublayer 412, that is, a thickness of the sublayer close to the photoelectric conversion layer 320 is smaller, so that the sublayer close to the photoelectric conversion layer 320 has a higher electrical conductivity, and the problem of the excessively large potential barrier between the photoelectric conversion layer 320 and the second hole blocking layer 222 can be better mitigated. Meanwhile, by configuring the sublayer close to the second hole blocking layer 222 to have a lower electrical conductivity, the problem of an excessively large potential barrier between the first buffer layer 410 and the second hole blocking layer 222 can be mitigated.

In still some embodiments, a work function of a metal material in the first sublayer 411 is greater than a work function of a metal material in the second sublayer 412.

In these optional embodiments, the first sublayer 411 and the second sublayer 412 include different metal materials, and the work function of the metal material in the first sublayer 411 is larger, so that the electrical conductivity of the first sublayer 411 is higher, that is, the sublayer close to the photoelectric conversion layer 320 has a higher electrical conductivity, and the problem of the excessively large potential barrier between the photoelectric conversion layer 320 and the second hole blocking layer 222 can be better mitigated. Meanwhile, by configuring the sublayer close to the second hole blocking layer 222 to have a lower electrical conductivity, the problem of an excessively large potential barrier between the first buffer layer 410 and the second hole blocking layer 222 can be mitigated.

In yet some embodiments, the thickness of the first sublayer 411 is greater than the thickness of the second sublayer 412, and the work function of the metal material of the first sublayer 411 is greater than the work function of the metal material of the second sublayer 412, so as to better mitigate the problem of an excessively large potential barrier between the photoelectric conversion layer 320 and the hole blocking layer 220.

Optionally, the work function of the metal material in the first sublayer 411 is greater than 3.5 electron volts, and the work function of the metal material in the second sublayer 412 is less than or equal to 3.5 electron volts. By configuring the first sublayer 411 to have a larger overall work function and the second sublayer 412 to have a smaller work function, a potential barrier between the first sublayer 411 and the photoelectric conversion layer 320 is smaller, and a potential barrier between the second sublayer 412 and the second hole blocking layer 222 is smaller.

The first sublayer 411 and the second sublayer 412 may be arranged in a variety of materials, for example, the material of the first sublayer 411 includes aluminum, and the material of the second sublayer 412 includes ytterbium. These two materials have good electrical conductivity, meet the above work function relationship, and are simple to prepare and low in cost.

In the above embodiment, by introducing the first sublayer 411 and the second sublayer 412 between the photoelectric conversion layer 320 and the second hole blocking layer 222, the interfacial energy levels are rearranged, and thus the interfacial potential barrier is reduced. For example, when the material of the first sublayer 411 is aluminum, which can be in direct contact with the acceptor layer to form an ohmic contact. Further, the second sublayer 412 is arranged on a side of the first sublayer 411 away from the acceptor layer, and the material of the second sublayer 412 includes ytterbium, so that the interfacial potential barrier between the metal and the second hole blocking layer 222 can be effectively reduced.

In order to further illustrate the beneficial effects of the disclosure, the inventors perform experiments of comparative examples. The comparative examples implemented include: comparative example 1 and example 1, both of which provide a display panel including a light-emitting unit and a photoelectric sensing unit.

The differences between example 1 and comparative example 1 lie in that the first sublayer 411 and the second sublayer 412 are arranged between the photoelectric conversion layer 320 and the second hole blocking layer 222, the material of the first sublayer 411 is aluminum, and the material of the second sublayer 412 is ytterbium. Also, the first sublayer 411 and the second sublayer 412 have a thickness of 1 nanometer.

Figure 8:
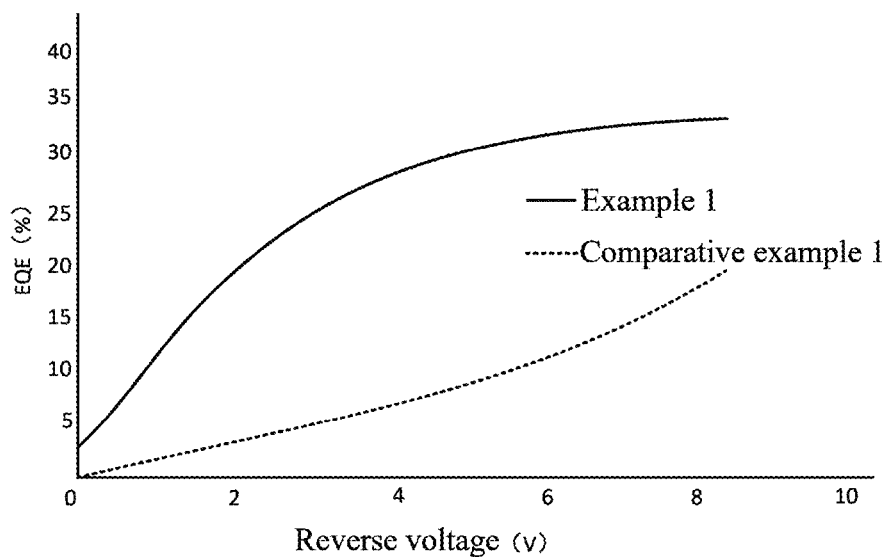
FIG. 8 is a graph of a test result of a display panel according to an embodiment of the disclosure.

By testing comparative example 1 and example 1 mentioned above with incident light having a wavelength of 590 nanometers, a graph as shown in FIG. 8 and the following table are obtained. The horizontal coordinates in FIG. 8 represent a reverse voltage applied to the OPD. It can be obviously seen from FIG. 8 that, the EQE in comparative example 1 is very low when no buffer layer 400 is provided. However, the EQE of the display panel under-3V is significantly improved by 25% after the first sublayer 411 and the second sublayer 412 are introduced. Under a higher voltage, the EQE gradually saturates, indicating that most of photo-generated carriers are extracted, and that the first sublayer 411 and the second sublayer 412 significantly reduce the interfacial potential barrier between the second hole blocking layer 222 and the photoelectric conversion layer 320.

| Display panel | EQE | Dark current |
| --- | --- | --- |
| Comparative example 1 | 4% | 39 nA/cm$^2$ |
| Example 1 | 25% | 19 nA/cm$^2$ |

In addition, by introducing the first sublayer 411 and the second sublayer 412 as shown in the above table, the dark current is also lowered from 39 nA/cm$^2$ to 19 nA/cm$^2$. It should be noted that a plurality of thicknesses of aluminum and ytterbium can be kept to be about 1 nanometer, and that the excessively thick aluminum and ytterbium will reduce the light absorptivity of the device in consideration of the reflection and absorption characteristics of the metals and thus lower the EQE; while excessively thin metals cannot form an effective electrical connection, causing an unsatisfactory effect of lowering the potential barrier.

In some other optional embodiments, a single metal layer may also be selected as the buffer layer 400. For example, the buffer layer 400 includes only the first sublayer 411 and/or the second sublayer 412 described above.

Figure 9:
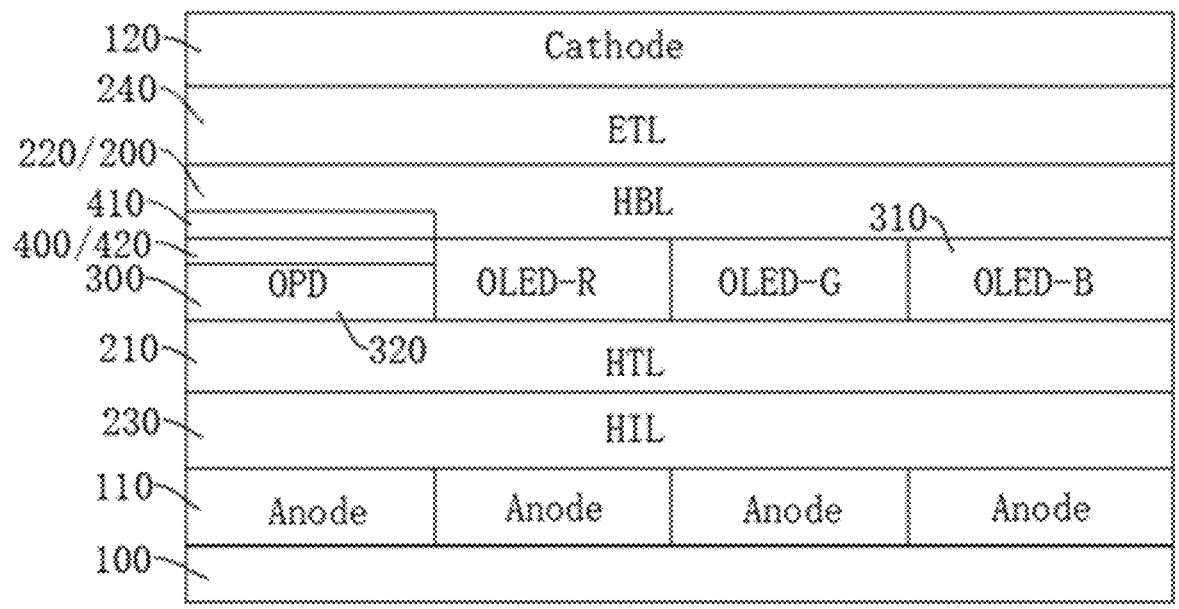
FIG. 9 is a schematic diagram of a layer structure of a display panel according to a further embodiment of the disclosure.
Figure 10:
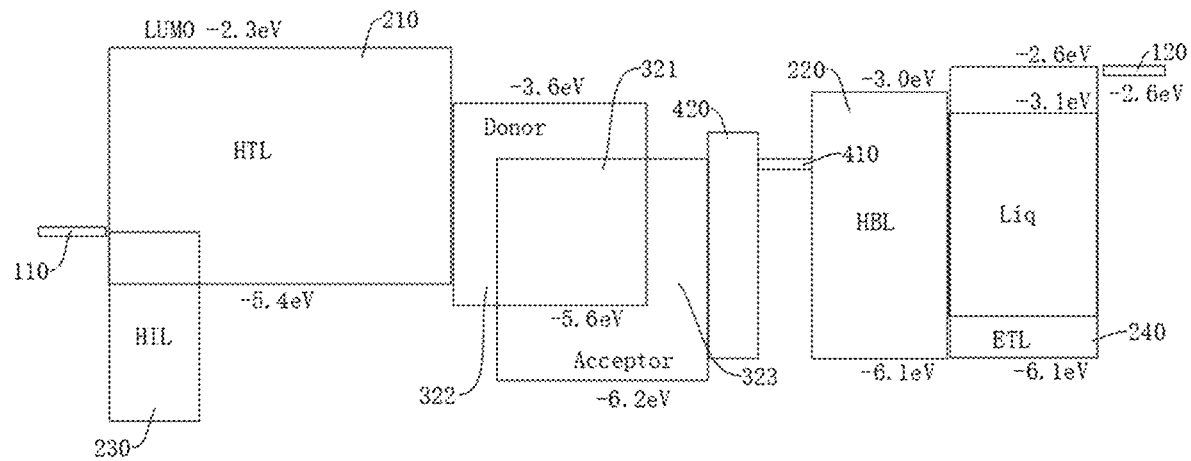
FIG. 10 is a schematic diagram of an energy level structure of a display panel according to a still further embodiment of the disclosure.

In some optional embodiments, as shown in FIGS. 9 and 10, the buffer layer 400 includes a second buffer layer 420. The second buffer layer 420 is arranged between the first buffer layer 410 and the photoelectric conversion layer 320, and a material of the second buffer layer 420 includes an electron transport material.

In these optional embodiments, the second buffer layer 420 is added between the second sublayer 412 and the photoelectric conversion layer 320, and the material of the second buffer layer 420 includes the electron transport material. For example, the material of the second buffer layer 420 is the same as the material of the electron transport layer 240, so that the electrons are more easily transported between the photoelectric conversion layer 320 and the second hole blocking layer 222, and the problem of a larger potential barrier between the photoelectric conversion layer 320 and the second hole blocking layer 222 can be better mitigated.

Figure 11:
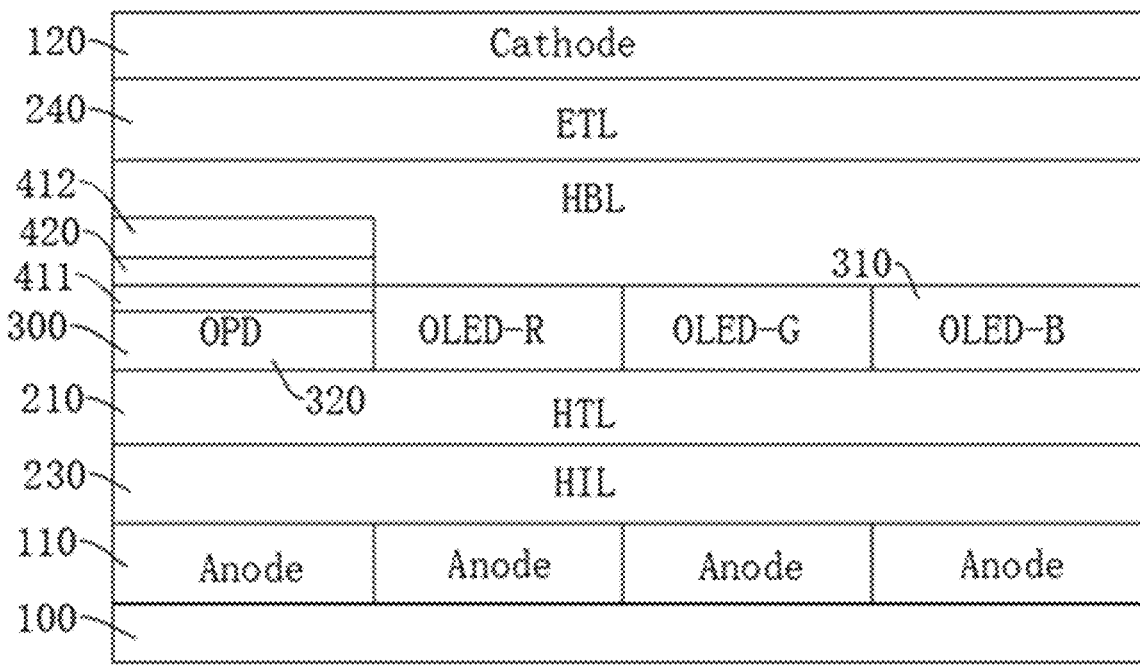
FIG. 11 is a schematic diagram of a layer structure of a display panel according to yet another embodiment of the disclosure.
Figure 12:
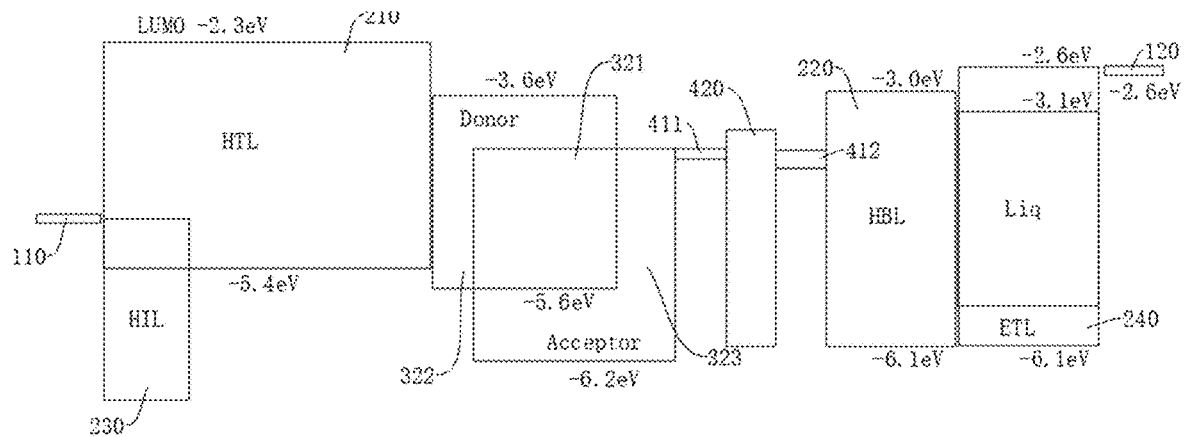
FIG. 12 is a schematic diagram of an energy level structure of a display panel according to yet another embodiment of the disclosure.
Figure 13:
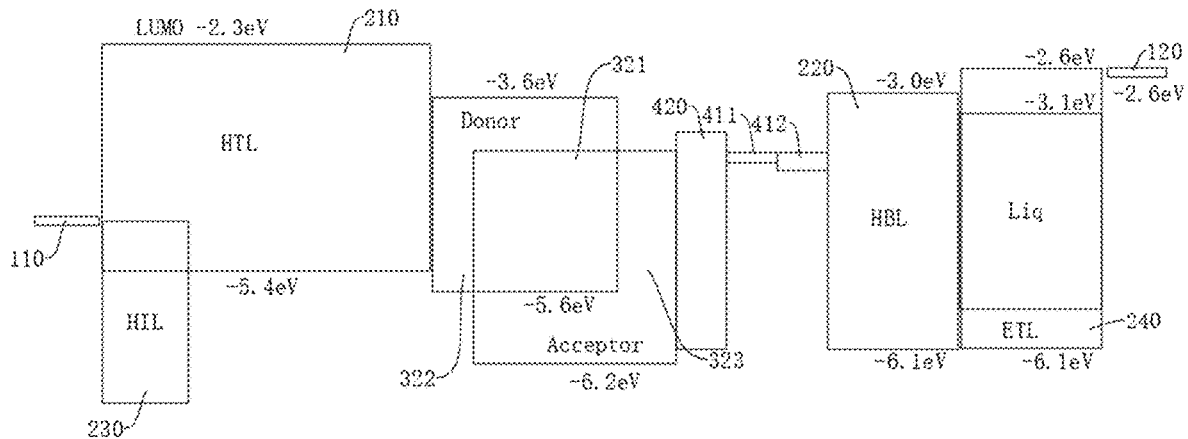
FIG. 13 is a schematic diagram of an energy level structure of a display panel according to yet another embodiment of the disclosure.

Optionally, as shown in FIGS. 11 and 12, when the first buffer layer 410 includes the first sublayer 411 and the second sublayer 412, the second buffer layer 420 may be arranged between the second sublayer 412 and the photoelectric conversion layer 320, for example, the second buffer layer 420 may be located between the first sublayer 411 and the second sublayer 412; alternatively, as shown in FIG. 13, the second buffer layer 420 may be located between the first sublayer 411 and the photoelectric conversion layer 320, that is, the second buffer layer 420 is located between the first buffer layer 410 and the photoelectric conversion layer 320.

Optionally, as described above, the display panel further includes the electron transport layer 240, the material of the second buffer layer 420 being the same as the material of the electron transport layer 240 so as to simplify a preparation process for the display panel.

For example, the material of the second buffer layer 420 includes a host material and an n-type dopant, so that the second buffer layer 420 has good electron transport capability.

The host material may include at least one of 2,9-dimethyl-4,7-diphenyl-1,10-phenanthroline (with its chemical name abbreviated as: BCP), 4,7-diphenyl-1,10-phenanthroline (with its chemical name abbreviated as: Bphen) and 2,9-bis(naphthalen-2-yl)-4,7-diphenyl-1,10-phenanthroline (with its chemical name abbreviated as: Nbphen), such that the host material has the advantages of easy preparation and low cost.

Optionally, a thickness of the second buffer layer 420 is not less than 0.5 nanometers, and the thickness of the second buffer layer 420 is not greater than 10 nanometers. The problem can be mitigated that the excessively small thickness of the second buffer layer 420 affects the functioning thereof, and the problem can also be mitigated that the excessively large thickness of the second buffer layer 420 causes an excessively large electron transport distance. The excessively thin second buffer layer 420 cannot play an effective blocking effect, while the excessively thick second buffer layer 420 blocks the extraction of photogenerated holes.

In addition, by introducing the second buffer layer 420 including the electron transport material, the transport material in the second buffer layer 420 and metal atoms in the first buffer layer 410 may form a complex or a hot metal material that may form a trap energy level therein. Optionally, when an electron transport material with a phenanthroline structure, such as 2,9-dimethyl-4,7-diphenyl-1,10-phenanthroline (with its chemical name abbreviated as: BCP), 4,7-diphenyl-1,10-phenanthroline (with its chemical name abbreviated as: Bphen), or 2,9-bis(naphthalen-2-yl)-4,7-diphenyl-1,10-phenanthroline (with its chemical name abbreviated as: Nbphen) is selected as the host material of the second buffer layer 420, the host material and the metal atoms can form a complex to improve the electrical conductivity and achieve an n-type doped effect.

The second buffer layer 420 may optionally be a single-layer or multi-layer metal layer. For example, the second buffer layer 420 may be configured in the same manner as the first buffer layer 410, and the second buffer layer 420 may include a third sublayer and a fourth sublayer that are arranged in a stacked manner, the third sublayer being configured in the same manner as the first sublayer 411, and the fourth sublayer being configured in the same manner as the second sublayer 412.

In order to further illustrate the beneficial effects of the disclosure, the inventors perform experiments of comparative examples. The comparative examples implemented include: comparative example 2 and example 2, both of which provide a display panel including a light-emitting unit and a photoelectric sensing unit.

The differences between example 2 and comparative example 2 lie in that the first buffer layer 410 and the second buffer layer 420 are arranged between the photoelectric conversion layer 320 and the second hole blocking layer 222, the material of the first buffer layer 410 includes aluminum and ytterbium, the second buffer layer 420 has a thickness of 3 nanometers, and the material of the third buffer layer 430 is the same as the material of the electron transport layer 240.

Figure 14:
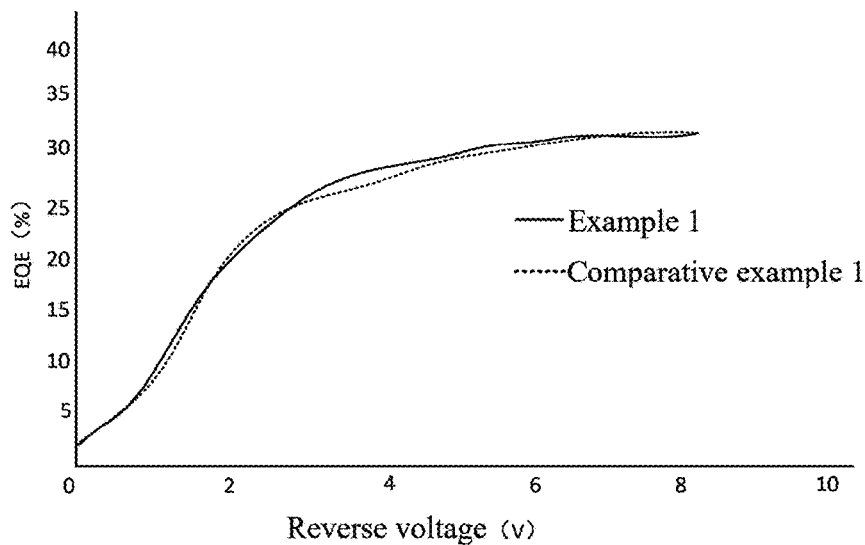
FIG. 14 is a graph of a test result of a display panel according to another embodiment of the disclosure.
Figure 15:
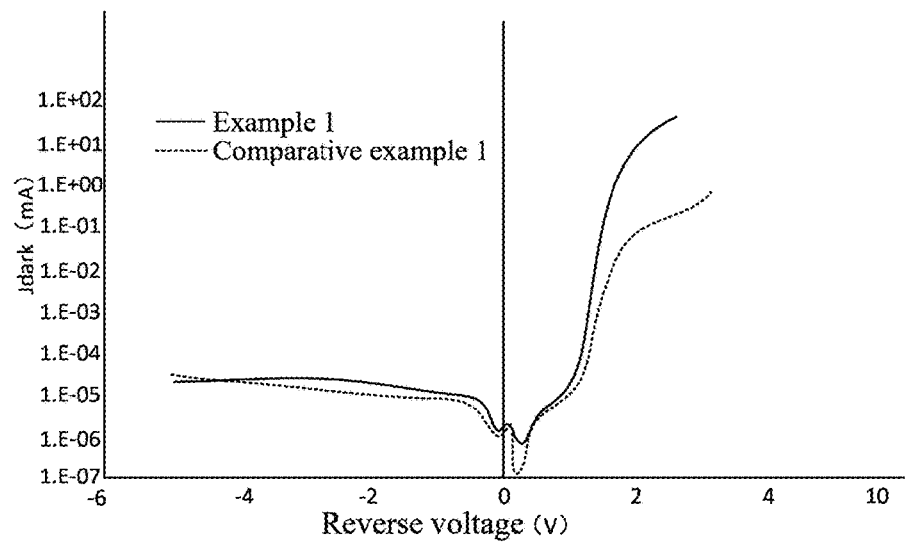
FIG. 15 is a graph of another test result of a display panel according to another embodiment of the disclosure.

By testing comparative example 2 and example 2 with incident light having a wavelength of 590 nanometers, graphs as shown in FIGS. 14 and 15 are obtained. The horizontal coordinates in FIGS. 14 and 15 represent a reverse voltage applied to the OPD. The vertical coordinates in FIG. 14 represent the EQE, the vertical coordinates in FIG. 15 represent a dark current (Jdark), and it can be seen from FIGS. 14 and 15 that, after the second buffer layer 420 is introduced, the EQE remains unchanged substantially, but a forward current of the device increases significantly, indicating that the interfacial electrical contact is improved.

In a circuit, a high forward current is conducive to fast reset of the OPD and can improve a response speed.

Figure 16:
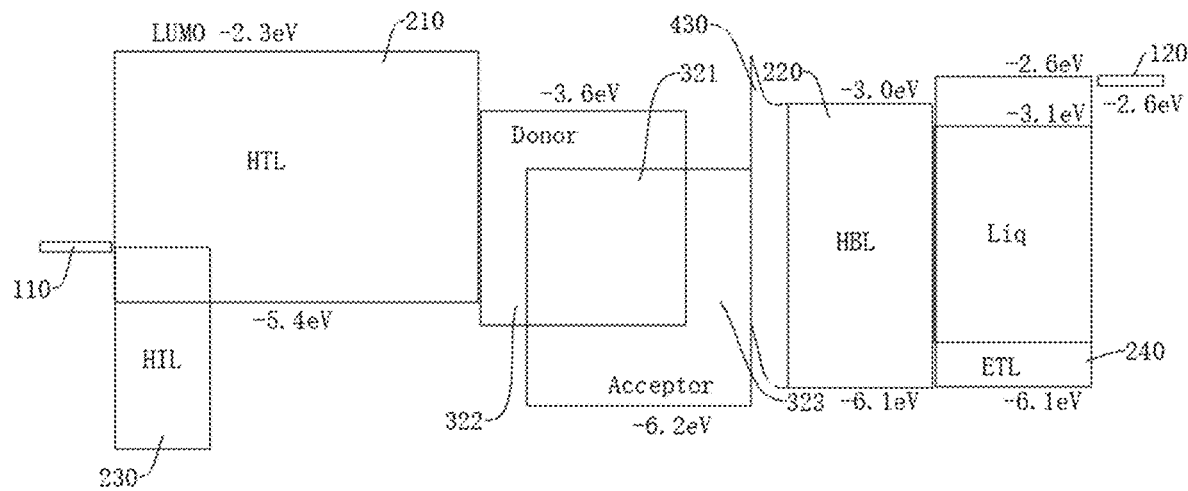
FIG. 16 is a schematic diagram of a layer structure of a display panel according to yet another embodiment of the disclosure.

In some optional embodiments, as shown in FIG. 16, the buffer layer 400 includes a third buffer layer 430, a material of the third buffer layer 430 includes a host material and an n-type dopant, and the n-type dopant includes the metal elements, so that the third buffer layer 430 has a higher electrical conductivity, which facilitates electron transport.

Optionally, when the first buffer layer 410 is arranged between the photoelectric conversion layer 320 and the second hole blocking layer 222, or the first buffer layer 410 and the second buffer layer 420 are arranged between the photoelectric conversion layer 320 and the second hole blocking layer 222, no third buffer layer 430 may be arranged between the photoelectric conversion layer 320 and the second hole blocking layer 222. Alternatively, the first buffer layer 410, the second buffer layer 420 and the third buffer layer 430 are arranged between the photoelectric conversion layer 320 and the second hole blocking layer 222.

Optionally, the host material in the third buffer layer 430 may be configured in the same manner as the second buffer layer 420, for example, the host material in the third buffer layer 430 may include an electron transport material with a phenanthroline structure, for example, at least one of 2,9-dimethyl-4,7-diphenyl-1,10-phenanthroline (with its chemical name abbreviated as: BCP), 4,7-diphenyl-1,10-phenanthroline (with its chemical name abbreviated as: Bphen) and 2,9-bis(naphthalen-2-yl)-4,7-diphenyl-1,10-phenanthroline (with its chemical name abbreviated as: Nbphen), so that the host material in the third buffer layer 430 has the advantages of easy preparation and low cost. Optionally, the n-type dopant may be selected from the acceptor or the material of the second hole blocking layer 222, that is, the material of the n-type dopant may be the same as the material of part of the photoelectric conversion layer 320, or the material of the n-type dopant may be the same as the material of the second hole blocking layer 222.

Optionally, the third buffer layer 430 may be a single-layer structural body.

Alternatively, in other embodiments, the third buffer layer 430 includes a plurality of sublayers, and absolute values of LUMO energy levels of the host materials of the sublayers increase gradually in a direction away from the photoelectric conversion layer 320. That is, in the direction away from the photoelectric conversion layer 320, the absolute value of the LUMO energy level of the host material of a previous sublayer is less than the absolute value of the LUMO energy level of the host material of a latter sublayer so as to reduce the potential barrier between the third buffer layer 430 and the second hole blocking layer 222.

Optionally, when the third buffer layer 430 includes a plurality of sublayers, the plurality of sublayers may have the same thickness so as to simplify the preparation of the display panel.

Optionally, the n-type dopant in the third buffer layer 430 includes at least one of a metal compound and a metal having a low work function. For example, the n-type dopant in the third buffer layer 430 includes the metal having the low work function, the work function of the metal having the low work function being less than 3.5 electron volts such that the third buffer layer 430 has an appropriate electrical conductivity. Optionally, when the n-type dopant in the third buffer layer 430 includes the metal having the low work function, the metal having the low work function may include at least one of ytterbium, lithium, calcium and cesium which have good electrical conductivity and appropriate work functions and are capable of meeting use requirements and low in cost.

In the above-described embodiment, by introducing the third buffer layer 430, a carrier concentration can be increased, the electrical conductivity can be improved, the interfacial energy levels can thus be bent, and the photoelectrons can pass through the interfacial potential barrier under a tunneling effect, significantly improving the extraction efficiency and EQE of the photogenerated carriers.

In some other embodiments, the material of the n-type dopant of the third buffer layer 430 may further include at least one of a metal oxide and a compound, as long as the material of the third buffer layer 430 includes the host material and the n-type dopant such that the third buffer layer 430 has a good electrical conductivity. When the material of the n-type dopant of the third buffer layer 430 includes a metal compound, the n-type dopant of the third buffer layer 430 may include at least one of lithium carbonate, cesium carbonate, lithium amide and $W_2(hpp)_4Cl_2$.

Optionally, a thickness of the third buffer layer 430 is not less than 0.5 nanometers, and the thickness of the third buffer layer 430 is not greater than 20 nanometers. When the thickness of the third buffer layer 430 is within the above-mentioned range, it is possible to ensure that the thickness of the third buffer layer 430 is not excessively small to affect the degree to which the third buffer layer improves the potential barrier between the photoelectric conversion layer 320 and the second hole blocking layer 222, and it is also possible to ensure that the thickness of the third buffer layer 430 is not excessively large to affect the efficiency of signal transmission due to an excessively long transmission path of the electrons. As an optional embodiment, the third buffer layer 430 has a thickness not less than 1 nanometer, and the third buffer layer 430 has a thickness not greater than 10 nanometers, so that the problem of the third buffer layer 430 being excessively thick or thin is better mitigated.

In some optional embodiments, the n-type dopant in the third buffer layer has an amount of substance X, the material of the third buffer layer has an amount of substance Y, and the ratio of X to Y is not less than 0.1% and not greater than 10%; and an excessively high doping ratio or an excessively thick film will cause an increase in the absorptivity of the electrons by the film, thereby reducing the EQE, while an excessively low doping ratio or an excessively thin film makes it difficult to form an effective energy level transition. When the above ratio is in a range from 0.1% to 10%, the third buffer layer 430 can have an appropriate electrical conductivity. Further, the above ratio is not less than 0.5% and not greater than 10%.

Figure 17:
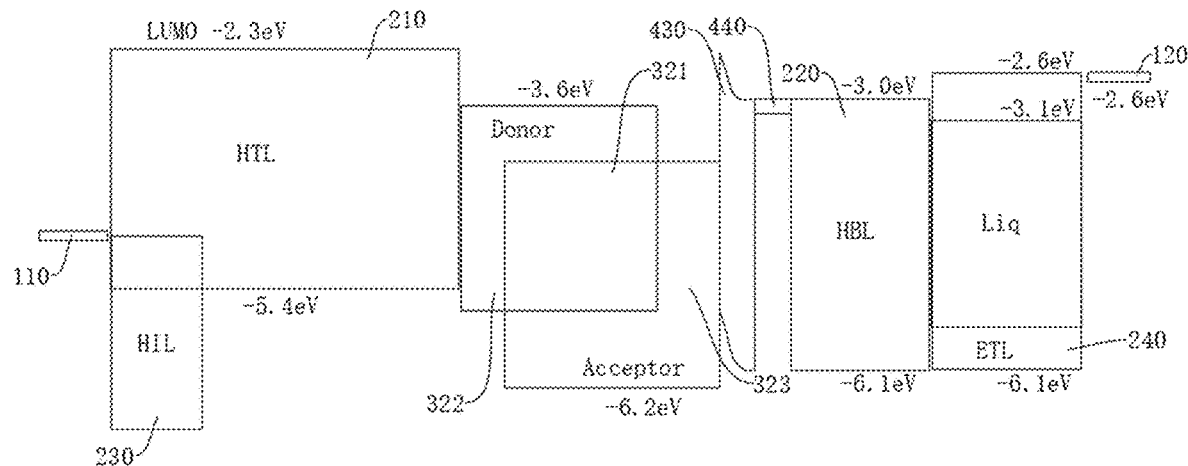
FIG. 17 is a schematic diagram of an energy level structure of a display panel according to yet another embodiment of the disclosure.

In some optional embodiments, when the buffer layer 400 includes the third buffer layer 430, as shown in FIG. 17, the buffer layer 400 may further include a fourth buffer layer 440, a material of the fourth buffer layer 440 includes at least one of a metal and a metal oxide, and the fourth buffer layer 440 is arranged on a side of the third buffer layer 430 facing or away from the photoelectric conversion layer 320.

In these optional embodiments, by adding the fourth buffer layer 440 of which the material includes at least one of the metal and the metal oxide, the electrical conductivity of the buffer layer 400 can be further increased, and the problem of the excessively large potential barrier between the photoelectric conversion layer 320 and the hole blocking layer 220 can be better mitigated.

Figure 18:
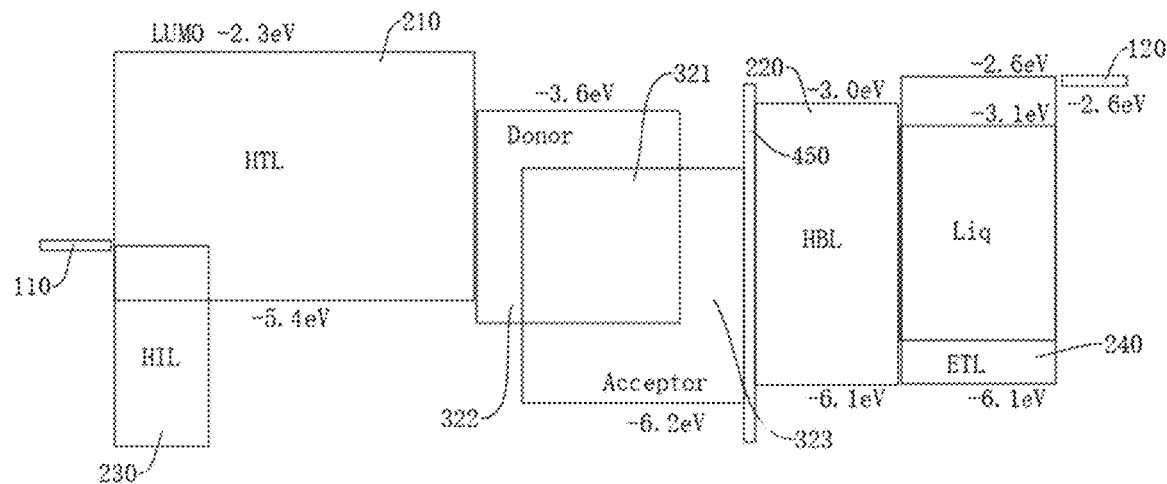
FIG. 18 is a schematic diagram of an energy level structure of a display panel according to yet another embodiment of the disclosure.

In some optional embodiments, as shown in FIG. 18, the buffer layer 400 further includes a fifth buffer layer 450, the fifth buffer layer 450 being prepared from at least one of a metal, an alkali metal compound and an alkaline earth metal compound, so that the buffer layer 400 has a good electrical conductivity.

Optionally, the fifth buffer layer is prepared from at least one of lithium carbonate, cesium carbonate, lithium nitride and lithium fluoride.

Optionally, when the fifth buffer layer 450 is prepared from at least one of an alkali metal compound and an alkaline earth metal compound. These materials are decomposed in the preparation and evaporation process, producing an alkali metal, an alkaline earth metal oxide or an elemental substance having a low work function, or having an insulation property, thus effectively reducing the interfacial potential barrier under an interfacial tunneling effect.

Optionally, a thickness of the fifth buffer layer 450 is not less than 0.5 nanometers, and the thickness of the fifth buffer layer 450 is not greater than 5 nanometers. The excessively thin fifth buffer layer 450 is less effective in improving the potential barrier, while the excessively thick fifth buffer layer 450 layer causes a large series resistance, thus reducing the EQE. However, the fifth buffer layer 450 within the thickness range can ensure that the thickness of the fifth buffer layer 450 is not excessively small to be difficult to mitigate the problem of the excessively large potential barrier between the photoelectric conversion layer 320 and the second hole blocking layer 222, and can also ensure that the thickness of the fifth buffer layer 450 is not excessively large to cause an excessively long transmission path of the electrons.

Figure 19:
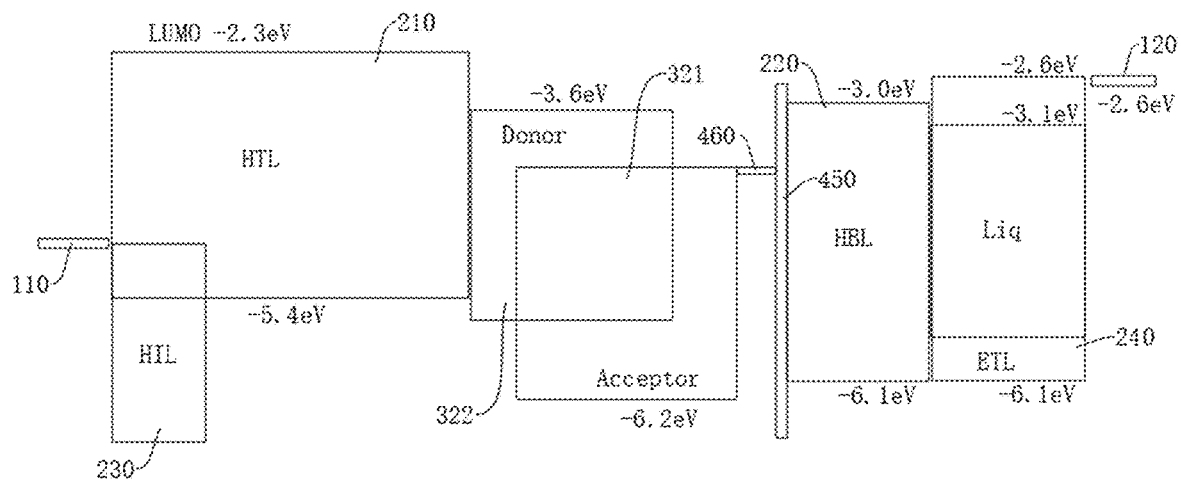
FIG. 19 is a graph of a test of a display panel according to an embodiment of the disclosure.

In some optional embodiments, as shown in FIG. 19, the buffer layer 400 further includes a sixth buffer layer 460, the sixth buffer layer 460 being arranged on a side of the fifth buffer layer 450 facing the photoelectric conversion layer 320, a material of the sixth buffer layer 460 including a metal having a high work function, and the work function of the metal having the high work function being greater than or equal to 4.0 electron volts, so as to improve the overall electrical conductivity of the buffer layer 400.

Optionally, the metal having the high work function may be at least one of aluminum and silver. These metals have a higher work function and are easy to obtain, so that the preparation cost of the display panel can be reduced.

Optionally, the sixth buffer layer 460 may be located between the fifth buffer layer 450 and the photoelectric conversion layer 320 so as to better mitigate the problem of an excessively large potential barrier.

Optionally, a thickness of the sixth buffer layer 460 is not less than 0.5 nanometers, and the thickness of the sixth buffer layer 460 is not greater than 5 nanometers. It is possible to ensure that the thickness of the sixth buffer layer 460 is not excessively small to be difficult to mitigate the problem of the excessively large potential barrier between the photoelectric conversion layer 320 and the hole blocking layer 220, and it is also possible to ensure that the thickness of the sixth buffer layer 460 is not excessively large to cause an excessively long transmission path of the electrons.

In some other embodiments, the fifth buffer layer 450 may include a blend structure of a metal, an alkali metal and an alkaline earth metal compound, for example, it is prepared by means of co-evaporation.

Optionally, the display panel may include the first buffer layer 410, or the display panel may include the first buffer layer 410 and the second buffer layer 420, or the display panel may include the third buffer layer 430, or the display panel may include the third buffer layer 430 and the fourth buffer layer 440, or the display panel may include the fifth buffer layer 450, or the display panel may include the fifth buffer layer 450 and the sixth buffer layer 460. Alternatively, the display panel may include at least one of the first buffer layer 410, the second buffer layer 420, the third buffer layer 430, the fourth buffer layer 440, the fifth buffer layer 450 and the sixth buffer layer 460.

Figure 20:
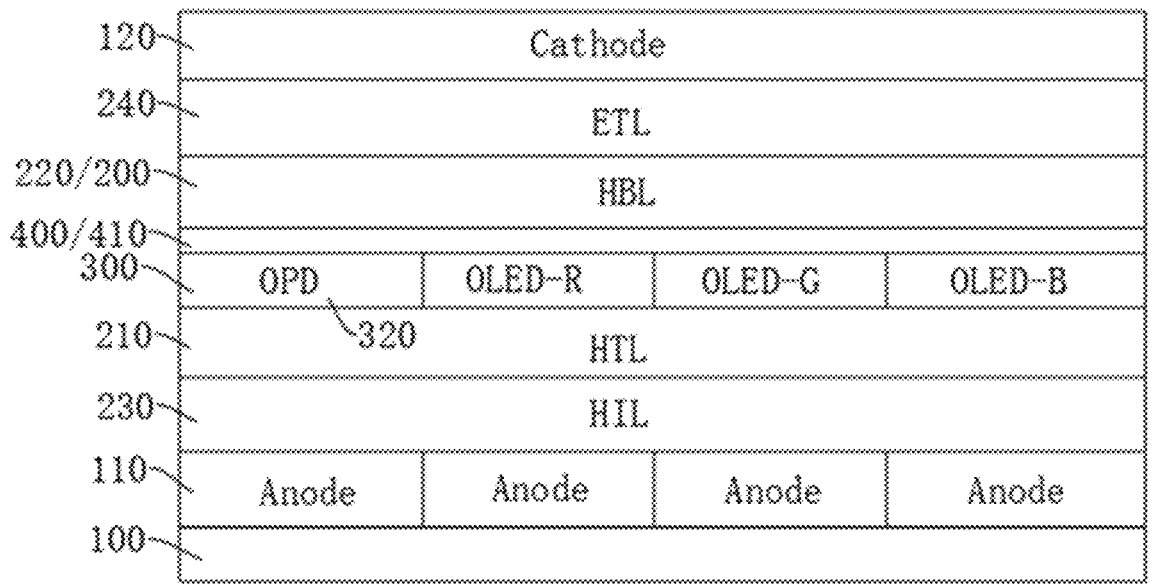
FIG. 20 is a schematic diagram of a layer structure of a display panel according to yet another embodiment of the disclosure.
Figure 21:
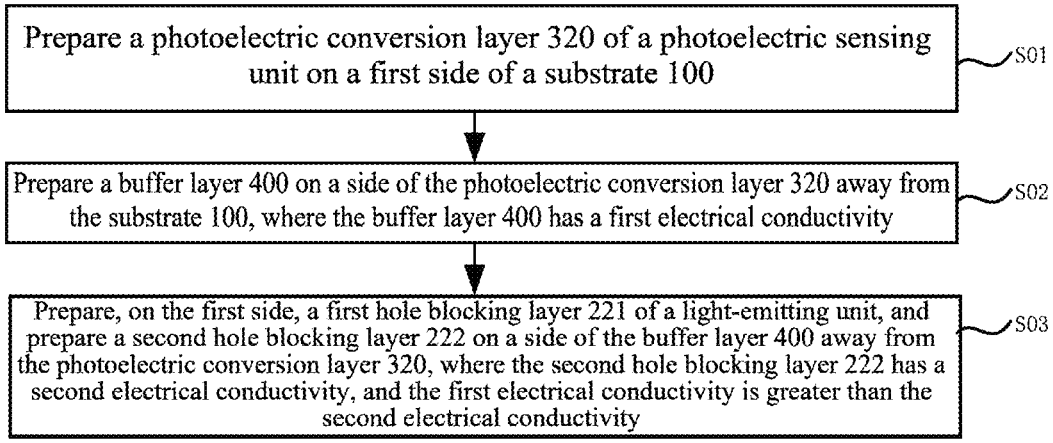
FIG. 21 is a schematic diagram of a preparation flow of a display panel according to an embodiment of the disclosure.

Optionally, in any one of the above-described embodiments, the buffer layer 400 and the photoelectric conversion layer 320 may be arranged in a one-to-one correspondence manner. When a plurality of photoelectric conversion layers 320 are provided and are distributed at intervals, a plurality of buffer layers 400 may also be provided, and an orthographic projection of each photoelectric conversion layer 320 on the substrate 100 is within an orthographic projection of the corresponding buffer layer 400 on the substrate 100. Alternatively, as shown in FIG. 20, the buffer layer 400 may be a common layer, and orthographic projections of the photoelectric conversion layer 320 and the light-emitting layer 310 on the substrate 100 are located within the orthographic projection of the buffer layer 400 on the substrate 100.

An embodiment in a second aspect of the disclosure further provides a display device, including a display panel according to any one of the above-described embodiments in the first aspect. Since the display device according to the embodiment in the second aspect of the disclosure includes the display panel according to any one of the above-described embodiments in the first aspect, the display device according to the embodiment in the second aspect of the disclosure has the beneficial effects of the display panel according to any one of the above-described embodiments in the first aspect, which will not be repeated herein.

The display device in the embodiment of the disclosure includes, but is not limited to devices having a display function, such as a cell phone, a personal digital assistant (PDA), a tablet computer, an e-book, a television, an access control, a smart fixed-line telephone, or a control console.

An embodiment in a third aspect of the disclosure further provides a preparation method for a display panel. The display panel may be a display panel according to any one of the above-described embodiments in the first aspect. Referring to FIGS. 1 to 21 together, the preparation method for the display panel may include:
- step S01, preparing a photoelectric conversion layer 320 of a photoelectric sensing unit on a first side of a substrate 100;
- step S02, preparing a buffer layer 400 on a side of the photoelectric conversion layer 320 away from the substrate 100, where the buffer layer 400 has a first electrical conductivity; and
- step S03, preparing, on the first side, a first hole blocking layer 221 of a light-emitting unit, and preparing a second hole blocking layer 222 on a side of the buffer layer 400 away from the photoelectric conversion layer 320, where the second hole blocking layer 222 has a second electrical conductivity, and the first electrical conductivity is greater than the second electrical conductivity.

The display panel prepared from the method according to the embodiment of the disclosure includes a substrate 100, a hole transport layer 210, a light-emitting layer 310, a photoelectric conversion layer 320, a hole blocking layer 220 and a buffer layer 400. The light-emitting layer 310 is configured to achieve luminous display of the display panel, and the photoelectric conversion layer 320 is configured to achieve a photoelectric sensing function of the display panel. The hole transport layer 210 is configured to transport holes to achieve the conversion of an optical signal to an electrical signal, or the conversion of an electrical signal to an optical signal. The hole blocking layer 220 is configured to block the movement of holes from the photoelectric conversion layer 320 or the light-emitting layer 310 in a direction away from the hole transport layer 210, so as to improve the efficiency of photoelectric sensing or light emitting. The buffer layer 400 face is arranged between the hole blocking layer 220 and the photoelectric conversion layer 320, the electrical conductivity of the buffer layer 400 is greater than the electrical conductivity of the hole blocking layer 220, and there is a smaller potential barrier between the buffer layer 400 and the photoelectric conversion layer 320, so that the potential barrier between the hole blocking layer 220 and the photoelectric conversion layer 320 can be reduced, and the performance of the photoelectric conversion layer 320 can be enhanced. Therefore, according to the embodiment of the disclosure, the performance of a photo detector of the display panel can be enhanced by adding the buffer layer 400 between the photoelectric conversion layer 320 and the hole blocking layer 220.

Although the disclosure is described with reference to the preferred embodiments, various modifications can be made, and equivalents can be provided to substitute for the components thereof without departing from the scope of the disclosure. In particular, the technical features mentioned in the embodiments can be combined in any manner, provided that there is no structural conflict. The disclosure is not limited to the specific embodiments disclosed herein but includes all the technical solutions that fall within the scope of the claims.

What is claimed is:

1. A display panel, comprising:
   a substrate having a first side;
   a light-emitting unit arranged on the first side, the light-emitting unit comprising a first hole blocking layer; and
   a photoelectric sensing unit arranged on the first side, wherein the photoelectric sensing unit is configured to receive an optical signal and generate a corresponding electrical signal from the optical signal, and the photoelectric sensing unit comprises a photoelectric conversion layer, a buffer layer and a second hole blocking layer, the buffer layer being arranged on a side of the photoelectric conversion layer away from the substrate, and the second hole blocking layer being arranged on a side of the buffer layer away from the photoelectric conversion layer;
   wherein the first hole blocking layer and the second hole blocking layer are made of the same material, the buffer layer has a first electrical conductivity, and the second hole blocking layer has a second electrical conductivity, the first electrical conductivity being greater than the second electrical conductivity.

2. The display panel according to claim 1, wherein a material of the buffer layer comprises a metal element; and
   the first hole blocking layer and the second hole blocking layer are of an integrated structure.

3. The display panel according to claim 2, wherein the buffer layer comprises a first buffer layer, a material of the first buffer layer comprising a metal; and
   a thickness of the first buffer layer is not less than 0.5 nanometers and not greater than 2 nanometers.

4. The display panel according to claim 3, wherein the first buffer layer comprises a first sublayer and a second sublayer, the second sublayer being located on a side of the first sublayer away from the photoelectric conversion layer, and a thickness of the first sublayer being less than a thickness of the second sublayer;
  a work function of a metal material in the first sublayer is greater than a work function of a metal material in the second sublayer;
  the work function of the metal material in the first sublayer is greater than 3.5 electron volts, and the work function of the metal material in the second sublayer is less than or equal to 3.5 electron volts; and
  the metal material in the first sublayer comprises aluminum, and the metal material in the second sublayer comprises ytterbium.

5. The display panel according to claim 4, wherein the buffer layer further comprises a second buffer layer, a material of the second buffer layer comprising an electron transport material; and
  the second buffer layer is located between the first sublayer and the second sublayer, or the second buffer layer is located between the first sublayer and the photoelectric conversion layer.

6. The display panel according to claim 5, wherein the light-emitting unit further comprises a light-emitting layer and an electron transport layer, the first hole blocking layer being arranged on a side of the light-emitting layer away from the substrate, the electron transport layer being arranged on a side of the first hole blocking layer away from the light-emitting layer, and the material of the second buffer layer being the same as a material of the electron transport layer;
  the electron transport material in the second buffer layer has a phenanthroline structure; and
  a thickness of the second buffer layer is not less than 0.5 nanometers and not greater than 10 nanometers.

7. The display panel according to claim 6, wherein the electron transport material comprises at least one of 2,9-dimethyl-4,7-diphenyl-1,10-phenanthroline, 4,7-diphenyl-1,10-phenanthroline, and 2,9-bis(naphthalen-2-yl)-4,7-diphenyl-1,10-phenanthroline.

8. The display panel according to claim 2, wherein the buffer layer comprises a third buffer layer, a material of the third buffer layer comprising a host material and an n-type dopant, and the n-type dopant comprising the metal element;
  a material of the photoelectric conversion layer comprises a donor and an acceptor, the host material comprising at least one of an electron transport material, a material of the second hole blocking layer and the acceptor;
  the electron transport material has a phenanthroline structure;
  the n-type dopant comprises at least one of a metal compound and a metal having a low work function; and
  a thickness of the third buffer layer is not less than 1 nanometer and not greater than 10 nanometers.

9. The display panel according to claim 8, wherein the electron transport material comprises at least one of 2,9-dimethyl-4,7-diphenyl-1,10-phenanthroline, 4,7-diphenyl-1,10-phenanthroline, and 2,9-bis(naphthalen-2-yl)-4,7-diphenyl-1,10-phenanthroline.

10. The display panel according to claim 8, wherein the third buffer layer comprises a plurality of sublayers, and absolute values of LUMO energy levels of the host materials of the sublayers increase gradually in a direction in which the photoelectric conversion layer faces away from the substrate.

11. The display panel according to claim 8, wherein a work function of the metal having the low work function is less than 3.5 electron volts, and the metal having the low work function comprises at least one of ytterbium, lithium, calcium and cesium.

12. The display panel according to claim 8, wherein the metal compound comprises at least one of lithium carbonate, cesium carbonate, lithium amide and $W_2(hpp)_4$.

13. The display panel according to claim 8, wherein the n-type dopant has an amount of substance X, the material of the third buffer layer has an amount of substance Y, and the ratio of X to Y is not less than 0.5% and not greater than 10%.

14. The display panel according to claim 8, wherein the buffer layer further comprises a fourth buffer layer, a material of the fourth buffer layer comprising at least one of a metal and a metal oxide, and the fourth buffer layer being arranged on a side of the third buffer layer facing or away from the photoelectric conversion layer.

15. The display panel according to claim 2, wherein the buffer layer comprises a fifth buffer layer that is prepared from at least one of a metal, an alkali metal compound and an alkaline earth metal compound; and
  a thickness of the fifth buffer layer is not less than 0.5 nanometers and not greater than 5 nanometers.

16. The display panel according to claim 15, wherein the fifth buffer layer is prepared from at least one of lithium carbonate, cesium carbonate, lithium nitride and lithium fluoride.

17. The display panel according to claim 15, wherein a material of the fifth buffer layer comprises an alkali metal having a low work function, and the alkali metal having the low work function comprises lithium.

18. The display panel according to claim 15, wherein the buffer layer further comprises a sixth buffer layer, the sixth buffer layer being arranged on one side of the fifth buffer layer, a material of the sixth buffer layer comprising a metal having a high work function, and a work function of the metal having the high work function being greater than or equal to 4.0 electron volts.

19. The display panel according to claim 18, wherein the metal having the high work function includes at least one of aluminum and silver;
  the sixth buffer layer is arranged on a side of the fifth buffer layer facing the photoelectric conversion layer; and
  a thickness of the sixth buffer layer is not less than 0.5 nanometers and not greater than 5 nanometers.

20. A display device, comprising a display panel of claim 1.

* * * * *